United States Patent [19]

Crouch et al.

[11] Patent Number: 5,617,531

[45] Date of Patent: Apr. 1, 1997

[54] DATA PROCESSOR HAVING A BUILT-IN INTERNAL SELF TEST CONTROLLER FOR TESTING A PLURALITY OF MEMORIES INTERNAL TO THE DATA PROCESSOR

[75] Inventors: Alfred L. Crouch; Matthew D. Pressly, both of Austin; James G. Gay, Pflugerville; Clark G. Shepard; Pamela S. Laakso, both of Austin, all of Tex.

[73] Assignee: Motorola, Inc., Schaumburg, Ill.

[21] Appl. No.: 500,271

[22] Filed: Jul. 10, 1995

Related U.S. Application Data

[63] Continuation of Ser. No. 144,369, Nov. 2, 1993, abandoned.

[51] Int. Cl.$^6$ ...................................................... G06F 11/08
[52] U.S. Cl. ............................... 395/183.06; 395/182.03; 395/182.08; 371/27; 371/40.1
[58] Field of Search .......................... 395/183.06, 183.07, 395/182.03, 182.08; 371/21.1, 25.1, 27, 40.1

[56] References Cited

U.S. PATENT DOCUMENTS

| | | | |
|---|---|---|---|
| 4,414,669 | 11/1983 | Heckelman et al. | 371/49 |
| 4,680,761 | 7/1987 | Burkness | 371/25.1 |
| 4,905,142 | 2/1990 | Matsubara et al. | 364/200 |
| 5,012,471 | 4/1991 | Powell et al. | 371/27 |
| 5,029,166 | 7/1991 | Jarwala et al. | 371/22.1 |
| 5,041,742 | 8/1991 | Carbonaro | 307/452 |
| 5,047,710 | 9/1991 | Mahoney | 324/158 |
| 5,054,024 | 10/1991 | Whetsel | 371/22.3 |
| 5,097,206 | 3/1992 | Perner | 324/158 |
| 5,107,501 | 4/1992 | Zorian | 371/213 |
| 5,109,382 | 4/1992 | Fukunaka | 371/21.1 |
| 5,119,202 | 6/1992 | Hashimoto et al. | 358/213.11 |
| 5,181,191 | 1/1993 | Farwell | 368/113 |
| 5,202,978 | 4/1993 | Nozuyama | 395/575 |
| 5,220,281 | 6/1993 | Matsuki | 324/158 |
| 5,221,865 | 6/1993 | Phillips et al. | 307/465 |
| 5,225,721 | 7/1993 | Gal et al. | 307/475 |
| 5,229,657 | 7/1993 | Rackley | 307/443 |
| 5,230,000 | 7/1993 | Mozingo et al. | 371/22.4 |
| 5,258,986 | 11/1993 | Zerbe | 371/21.2 |
| 5,260,649 | 11/1993 | Parker et al. | 324/158 |
| 5,260,947 | 11/1993 | Posse | 371/22.3 |
| 5,260,948 | 11/1993 | Simpson et al. | 371/22.3 |
| 5,260,949 | 11/1993 | Hashizume et al. | 371/22.3 |
| 5,260,950 | 11/1993 | Simpson et al. | 371/22.3 |
| 5,285,153 | 2/1994 | Ahanin et al. | 324/22.1 |
| 5,301,156 | 4/1994 | Talley | 371/22.4 |
| 5,301,199 | 4/1994 | Ikenaga et al. | 371/22.5 |
| 5,323,108 | 6/1994 | Marker, III et al. | 371/27 |
| 5,325,367 | 6/1994 | Dekker et al. | 371/21.1 |

OTHER PUBLICATIONS

LSSD Compatible and Concurrently Testable RAM; Maeno; IEEE, 1992, pp. 608–614.

Testing of Embedded RAM Using Exhaustive Random Sequences; Maeno; IEEE, 1987, pp. 105–110.

Memory Testing; Fee; IEEE 1978, pp. 81–88.

High Quality Testing of Embedded RAMS Using Circular Self-Test Path; Krasniewski; IEEE, 1992, pp. 652–661.

A Realistic Self-Test Machine for Static Random Access Memories; Dekker; IEEE, 1988, pp. 353–361.

Built-In Self Testing of Embedded Memories; Jain; IEEE, 1986, pp. 27–37.

*Primary Examiner*—Robert W. Beausoliel, Jr.
*Assistant Examiner*—Dieu-Minh Le
*Attorney, Agent, or Firm*—Keith E. Witek

[57] ABSTRACT

A data processor (10) has a single test controller (11). The test controller (11) has a test pattern generator portion (26) and a memory verification element (27). The test pattern generator (26) generates and communicates a plurality of test patterns to the plurality of memories (12, 13, and 14) through a second storage device (17). A first storage device (16) is used to store data read from the plurality of memories (12, 13, and 14). The data from the first storage device is selectively accessed by the memory verification element (27) via the bus (31). A bit (32) or more than one bit is used to communicate to external to the processor (10) whether the memories (12, 13, and 14) are operating in an error free manner.

50 Claims, 5 Drawing Sheets

DATA PROCESSOR HAVING A BUILT-IN INTERNAL SELF TEST CONTROLLER FOR TESTING A PLURALITY OF MEMORIES INTERNAL TO THE DATA PROCESSOR

This application is a continuation of prior application Ser. No. 08/144,369, filed on Nov. 2, 1993 now abandoned, entitled "A DATA PROCESSOR HAVING A BUILT-IN INTERNAL SELF TEST CONTROLLER FOR TESTING A PLURALITY OF MEMORIES INTERNAL TO THE DATA PROCESSOR".

FIELD OF THE INVENTION

The present invention relates generally to testing integrated circuits, and more particularly, to on-chip testing of an integrated circuit having a plurality of memories.

BACKGROUND OF THE INVENTION

The trend in modern microprocessor integrated circuits is to include large amounts of internal memory. This memory is known as "internal embedded memory" because it is located on the integrated circuit and has limited accessibility both logically and physically (there are usually many levels of logic and convoluted pathways of logic to be able to place or retrieve data to or from a memory location—and most modern fabrication methods bury the physical memory cells, or arrays of memory cells, into the lower layers of the integrated circuit so that there is no direct physical access to the arrays of memory). Embedded memory is very difficult to test and verify in all necessary test environments, most specifically, determining faults resulting from the silicon manufacturing process (fabrication test), determining faults due to the dicing and packaging process (manufacturing test), and determining faults that cause infant mortality due to the stresses of first applying power (voltage, current, and the effects of operating temperature) to the device.

Since the function of the memory is very critical to the overall integrated circuit function, it is very important to verify that the memory survives through the overall manufacturing process and still operates as it was intended to. This means that a high level of testing is required to identify memory problems, and more testing is required to locate the source of the problem so that any problem can be corrected. An appropriate level of testing is not always possible for embedded memories unless specific test logic and architectures are included during the design process.

Historically, when smaller amounts of memory were embedded on integrated circuits (such as a single memory), the memory was made directly accessible to the manufacturing tester through the package pins (and usually the exact bus that fed the memory was the chip level data and address bus). This allowed many "external" test algorithms from the board test environment to be used (boards that contain only memory chips are a special class of testing known as "memory testing" and are connected directly up to memory testers). These algorithms conduct fault detection inductively by writing and reading repeating patterns of ones and zero's in a graphical manner. This results in a physical picture of the memory (if it were possible to look at a memory as a collection of small squares connected in the horizontal and vertical directions) that looks like a checkerboard, or horizontal or vertical stripes, made of ones and zero's. These testing algorithms and methods were transferred to integrated circuit testing by including the ability to do this kind of testing with very expensive (roughly 3 million dollar) testers. These testers, however, placed design restrictions on the types and designs of memory testing that the testers could do (the tester had to have direct access and the standard algorithms were not effective if the path into the memory had a pipelined architecture).

As the amount of memory embedded on integrated circuits increased, the disadvantages of doing external testing, with very expensive testers that were not portable, and having to affect the memory architecture design negatively, caused the industry to find alternative ways to testing. The result was Built-in-Self-Test (BIST). The original goal of BIST was to allow internal testing of the embedded memory, but to not cost as much internal design and logic impact as making a tester interface (having all internal embedded memory locations somehow accessible to the external package connections that connect to the tester). This resulted in the basic method that is the general state of the art in memory testing, the single memory with a pattern generator on the data input, a pattern generator on the address control input, and a signature analyzer on the data output. The reason that this is the predominant form of internal embedded memory testing is because it has a standardized design form that can be applied generically during the design phase. Even though the above method has been widely used in the art, it has a lot of major disadvantages.

The "single" memory BIST testing method basically requires that a single memory (an array of memory cells that have a contiguous address space and data space with identical word widths—and are usually made physically to be located in one area) have a Linear feed Back Shift Register (LFSR) placed across the data input signal lines and also requires that a counter or LFSR be placed across the address signal lines. The data output signal lines are required to have an LFSR configured as a data compressor (signature analyzer) connected to them. At a minimum, this requires that one LFSR bit be used for each data signal line for the input and one LFSR bit be used for each data signal output line. The address lines can be the Data LFSR or a separate device. This means for a 32-bit data bus, 32 input sequential devices and 32 output sequential devices are required at a minimum. This input side must also have a method to apply these 32-bits so a multiplexer or the sequential device must sit right in the functional path which negatively impacts the functional performance. The output side can have the device in the output path or attached in a parallel manner so that the data can be siphoned off. Either way this negatively affects the functional performance.

The biggest disadvantage to this kind of BIST testing, is that the ordered algorithmic type of testing that is available from the tester interface, is not available from an LFSR. A counter can be created that will address the memories in the right sequence, but the data supplied for writing comes from an LFSR which produces a pseudo-random set of data. There are many papers published describing the "statistical" coverage that can be had by using pseudo-random data and with conducting pseudo-random address sequences. These limitations come about because the LFSR is relied on to conduct testing.

The LFSR in its basic form is a standard design element that consists of an N-bit shift register that has some of its output signals brought back to the beginning of N-bit shift register through Exclusive-Or (XOR) logic circuitry. It operates by shifting a stream of bits from one end to the other (for example from the left-most bit towards the right-most bit). The state of all of the bits and the applied input signals all factor into the next state of the register.

When used as a pattern generator the device is known as a PRPG LFSR or Pseudo-Random Pattern Generator Linear Feedback Shift Register (since it will always repeat a set of patterns for a given initial state it is not entirely random but pseudo-random). The feedback for a PRPG is usually chosen to be a maximal polynomial which just means that the feedback is implemented in such a way as to cause the register to cycle through all possible $2^N$ states except the all zero state (e.g., for a 3 bit register N=3 so $2^N$ is 8 -minus the zero state 000 is 7 different states). A pattern generator does not have any external input, but starts from a fixed state (the seed) and continues through the sequence of all possible patterns at the rate of one pattern every time a clock signal is applied. This is what limits the type of data that can be placed into the memories for testing.

When PRPG is used for address control information, the resulting sequence of addresses is some non-ordered sequence. This means that the memory cannot be tested in a directed order based on its physical layout. Since memory faults are highly coupled to the exact physical topology, it is impossible to match a standard LFSR data and address sequence to exercise the most probable failure mechanisms.

When an LFSR is used for pattern compression, it is known as a signature analyzer. In this case, there is an initial state (a seed) and external input to the device. Each clock cycle captures the input and operates on it based on the state of the register and the feedback designed in.

The disadvantages of this kind of testing is that it does not effectively cover the memory for the type of faults that are predominant, the pattern generation units take up a large amount of physical area, as does the compression unit, and only one memory is tested. In integrated circuit designs with more than one memory, this entire scheme is wrapped around each individual memory (one pattern generator, address controller, and signature analyzer for each memory). This is a very inefficient use of integrated circuit area for such a low-effective test.

Several of the advances in the art have come from making the above method more effective. Extra circuitry has been added to give more flexibility to the PRPG patterns by allowing the changing of the seed or the feedback polynomial. Papers have been written discussing this method to increase coverage of random pattern resistant faults (1992 ITC—Generation of Vector Patterns through Reseeding of Multiple-Polynomial Linear Feedback Shift Registers, p120). Other methods have used the PRPG in conjunction with scan path registers placed on the data and address signals to "shift" patterns across these lines. One version of this method known as exhaustive random sequences (ERS) is described in the art. The ERS has the added disadvantage of separating the read and write (which should happen in two consecutive cycles) by the length of the scan chain (i.e. if it takes 32 shifts to load the scan path that feeds the data bus, then the memory has sat idle for 32 cycles before the data can be written in, and the same is true for the data written out, 32 clock cycles have to be used to collect the 32 bits of data).

All of the advances to this kind of BIST methodology cost in terms of circuit area and negatively impact circuit performance.

SUMMARY OF THE INVENTION

The previously mentioned disadvantages are overcome and other advantages achieved with the present invention. In one form, the present invention comprises a method for internally testing a plurality of embedded memories of a data processor. At least two of the plurality of embedded memories of the data processor are different. The method begins by generating, via an internal test controller of the data processor, a test pattern for the plurality of embedded memories. The test pattern is transmitted via at least one bus of the data processor to each embedded memory of the plurality of embedded memories. At least a portion of the test pattern is stored within predetermined cells of each embedded memory. The at least a portion of the test pattern is read by the internal test controller from the predetermined cells of each embedded memory. An integrity of each embedded memory is verified by the internal test controller.

In another form the invention comprises an internal test controller of a data processor, wherein the data processor includes a plurality of embedded memories. The internal test controller has a test pattern generator that generates a test pattern for each embedded memory within the plurality of embedded memories and sequentially provides the test pattern to each embedded memory of the plurality of embedded memories. The internal test controller also has a memory verification element that is operably coupled to the test pattern generator. The memory verification element is used to verify integrity of the plurality of embedded memories in response to the plurality of embedded memories processing the test pattern.

The present invention will be more clearly understood from the detailed description below in conjunction with the accompanying drawings.

Figure 1:
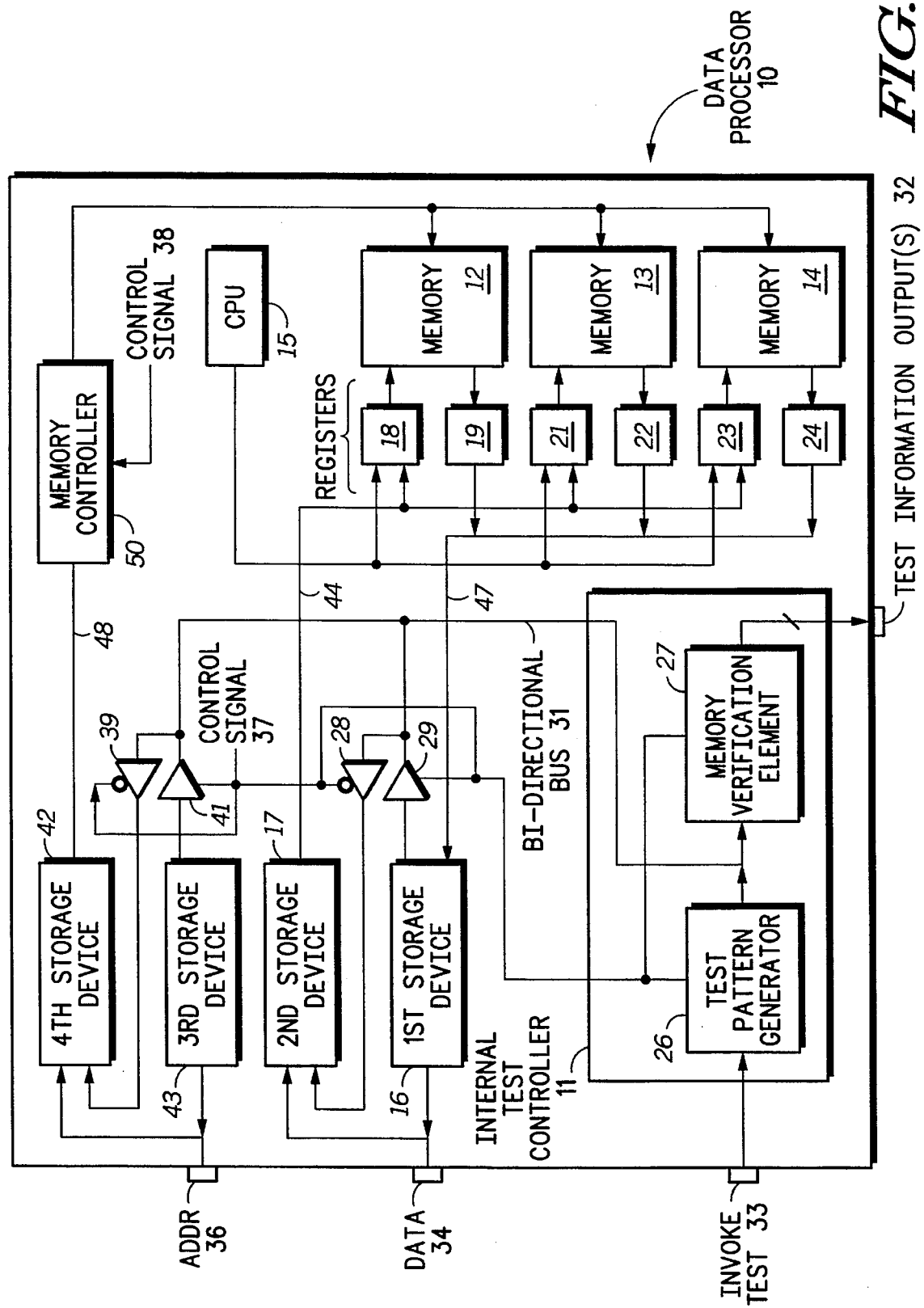
FIG. 1 illustrates, in a block diagram, a data processor having a test controller, both in accordance with the present invention.

It will be appreciated that for simplicity and clarity of illustration, elements illustrated in the FIGURES have not necessarily been drawn to scale. For example, the dimensions/size of some of the elements are exaggerated relative to other elements for clarity. Further, where considered appropriate, reference numerals have been repeated among the FIGURES to indicates corresponding or analogous elements.

DESCRIPTION OF A PREFERRED EMBODIMENT

Generally, the present invention provides a method and apparatus for internally testing a plurality of memories within a data processor. This testing is accomplished by performing a Memory Built-In-Self-Test (BIST) which can be invoked by transitioning a single external pin on the data processor or alternatively by placing a control word within an internal control register of the data processor and supplying only the data processor functional clock signal. The Built-In-Self-Test (BIST) is accomplished by conducting a sequence of events, that is controlled by a minimal amount of circuitry and is fully self-contained within the data processor.

In particular, the BIST is designed to select a single memory out of a set of many different memories (e.g., a plurality of four way set associative memories, where each memory may have different row depth, word bit lengths, number of banks, and address and data space relative to the common busses). Then, the BIST selects a memory word location (a row containing 32 bits) within the selected memory by directly generating and applying an address. A 32-bit value may be referred to herein as a longword data value. The BIST sequence then performs a write to each different memory location within the selected memory, with a specific set of repeated test patterns created within the data processor's single centralized test controller unit, and also performs a read from each memory location which simultaneously captures the results of the reading into a data compressing register. The data compressing register (i.e., a signature analyzer) is also contained fully within the single test controller within the data processor. The sequence controller selects a next memory after the first memory is tested and repeats the above steps until all memories in the data processor are tested.

The data and address information within the data processor are transmitted to the memories through a novel interface that consists of a special bi-directional bus coupled between the test controller to the global data processor data bus and address bus. The global data processor data bus and address bus are each pipelined data and address busses in a preferred form, and are interfaced to each individual memory's local data and address bus.

To prevent any functional performance loss due to interfacing test-only logic to the functional busses, the interface between the test controller bi-directional bus and the global data and address bus is done in such a way as to prevent capacitive loading of the global data and address bus by inserting/collecting the data to/from the existing input and output registers though D flip-flops that have two selectable D inputs and two Q outputs. In other words, the global data and address busses within the data processor, which are used in a normal mode of data processor operation, are not loaded by the test features due to the fact that the test-only logic is connected to a first plurality of flip-flop outputs and the global data and address busses are connected to a second plurality of flip-flop outputs. The first and second plurality of flip-flop outputs being logically identical but capacitively and resistively decoupled from one another. This type of interface also allows the BIST to be conducted with no requirement for specific logic values to be applied to the external signal pins of the data processor.

Figure 3:
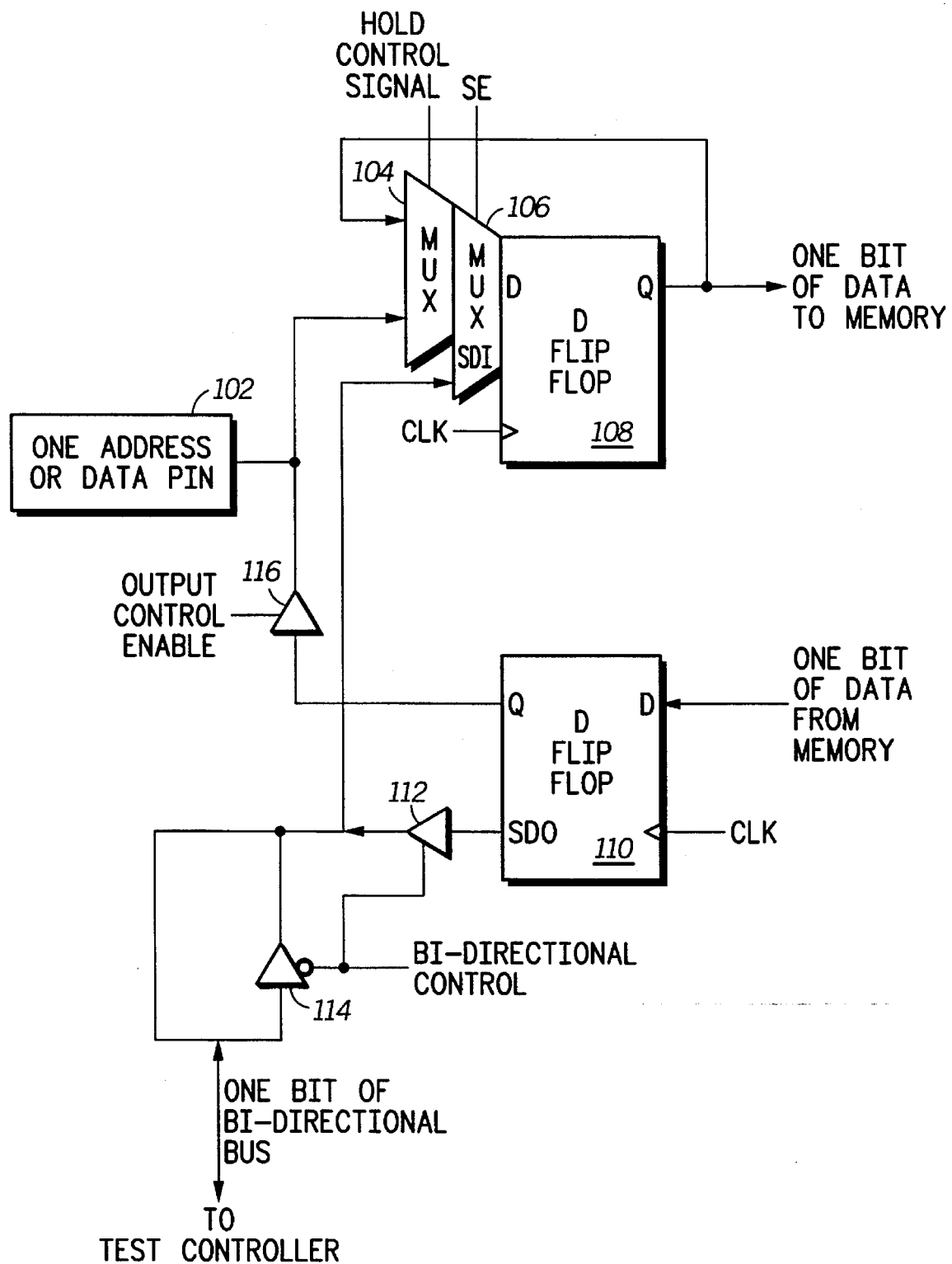
FIG. 3 illustrates, in a block diagram, a more detailed diagram of the 1st and 2nd storage devices of FIG. 1, in accordance with the present invention.

The actual D flip-flop circuits used to provide the isolation to eliminate internal address and data bus loading is illustrated in FIG. 3. FIG. 3 illustrates only one bit of one of either the first and second storage device or the third and fourth storage device. FIG. 3 illustrates either one data pin or one address pin 102, through which one bit is provided. Data coming from the pin 102 is input to a multiplexer (MUX) 104. The MUX 104 has an output which is one of either the data from the pin 102 or a Q output value of data already stored in a D flip-flop 108. A hold control signal is used to maintain the Q output value in the flip-flop 108, selectively. The output of the MUX 104 is connected to an input of a MUX 106. Another input of the MUX 106 is the serial data interface (SDI) from the bi-directional BIST bus. When in BIST mode, the input D of the flip-flop 108 comes from the SDI input and the address pin 102 is disconnected from the flip-flop 108 via the MUXES 104 and/or 106. BIST data therefore is provided on the SDI line, latched into flip-flop 108 via the clock (CLK) signal and sent to the memories via the Q output.

The bi-directional BIST bus in FIG. 3 is one bit of the bi-directional bus discussed in FIG. 1, the bi-directional BIST bus of FIG. 3 has two tristate buffers 112 and 114 which control the data flow direction of the bi-directional bus. If tristate buffer 114 is turned-on then one bit from the test controller is passed through the bi-directional bus to the SDI input of MUX 106. If the tristate buffer 112 is on then data from the SDO output of a D flip-flop 110 is sent to the test controller. A bi-directional control signal is designed so that only one of the tristate buffers 112, and 114 are on at any given time, in a preferred form.

In FIG. 3, data from the BIST test is sent to the memory from flip-flop 108 and the memory sends data back to the test controller through a flip-flop 110. Flip-flop 110 reads data from the memory via a D input and a CLK signal. In normal mode, this data would be sent via the output enable control signal and the output buffer 116 to the pin 102. In BIST mode, the data is sent through the bi-directional bus to the signature analyzer portion of the test controller. For a 32-bit address value, 32 flip-flops similar to flip-flop 108 and 32 flip-flops similar to flip-flop 110 are needed for the 32 address lines. Therefore, a total of 64 flip-flops are needed to support 32 address lines in a bi-directional manner. For a 32-bit data value, 32 flip-flop similar to flip-flop 108 and 32 flip-flops similar to flip-flop 110 are needed for the 32 data lines. Therefore, a total of 64 flip-flops are needed to support 32 data lines in a bi-directional manner. Given the information stated above, if 32 data lines and 32 address lines are supported as in FIG. 3 then a total of 128 flip-flops are used in a preferred form.

The actual application order of reads, writes, stall cycles (needed because of the pipelined nature of the memory interface), and pattern data was selected to provide the highest level of fault detection for the data processor. When the BIST is completed, the test controller will transition a package pin of the data processor to indicate the test is done (so no clock counting needs to be done by any external device), and the compressed read data from the memories (known as a signature) will be presented one bit at a time (serially) at another package pin on subsequent clock cycles. Furthermore, a single bit may be output for the data processor to indicate a pass/fail status of the recently tested internal memories of the data processor. This pass/fail bit provides a way to quickly determine if the memories internal to the data processor passed or failed.

Figure 2:
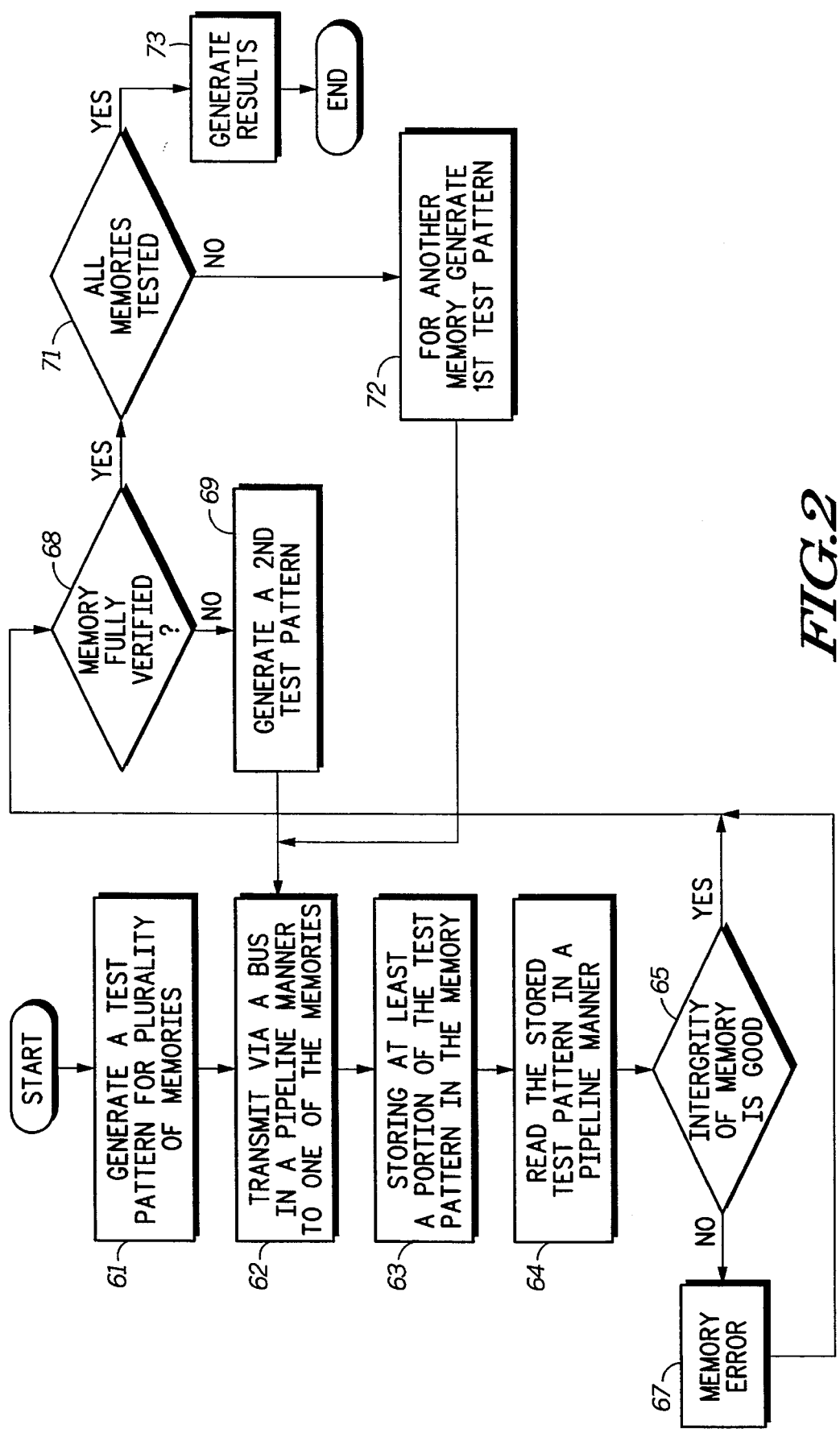
FIG. 2 illustrates, in a flow diagram, a method for testing a plurality of memories within a data processor using a single test controller internal to the data processor.

The present invention can be more fully understood with reference to FIGS. 1 and 2 herein. FIG. 1 illustrates a data processor 10 that includes a plurality of memories 12–14 coupled to a central processing unit (CPU) 15 and a single centralized test controller 11. It should be noted that more or less than three memories may be present in the data processor 10 and that three memories are represented in FIG. 1 by way of example.

When the single package pin 33 (referred to as the invoke test control signal in FIG. 1) is transitioned from a logic 0 to a logic 1 and held at the logic 1 state, the test controller 11 establishes that it is in BIST mode and reconfigures the data processor architecture so that the test controller 11 is now connected to the first, second, third, and fourth storage devices 16, 17, 43, and 42, respectively, through the bi-directional bus 31. Once pin 33 is asserted, the control signal 37 causes package pins 34 and 36 to no longer be connected to the storage devices 16, 17, 42, and 43 due to tri-state buffers (not illustrated) between the pins 34 and 36 and the devices 16, 17, 42, and 43. Note that data pins 34 preferably consist of 32 pins (i.e. to support longword data) and that address pins 36 also consist of 32 bits to support longword addresses in a preferred form. The architecture is also altered via a control signal 38, which is asserted in response to the assertion of the invoke test pin 33, to allow the functional memory controller 50 to pass control information from the test controller 11 to the memories 12–14.

The established BIST mode also allows a minimum hardware implementation sequencer, which is made from 7 nested sub-sequencers that total only 22 flip-flops, to begin operation. It is the purpose of 5 of these sequencers (18 flip-flops) to create the test pattern. These sequencers are known collectively as the test pattern generator 26. The 2 remaining sequencers provide read/write/stall control and test pattern generator control. One of the advantages of the BIST method and structure taught herein is that a minimal amount of logic is needed to implement a fully functional, complete, and flexible BIST.

The Memory Built-In-Self-Test (BIST) begins with the creation of a test pattern in test pattern generator 26. This pattern consists of binary logic values that make up both address (memory and memory location selection) information and pattern data information. As was stated earlier, this pattern is created by 5 of the 7 nested sequencers where the sequencers are in fact a set of counters and state machines (non-order number counters that do not count in the regular 1,2,3 order) which are dependent upon their own value and the value of the sequencers above them in priority, to increment to the next count value. These sequencers, listed here by priority order, provide the Test Address Count (selects which memory to test of the plurality of memories 12–14); the Longword Address Count (which selects which bank of memory to test for those memories with multiple banks); the Pattern Counter (which generates through a combinational function based on the state machine count number, the four bit binary values 0000, 1111, 0101, 1010, 0011, 1100, which are equivalent to hex (base 16) values of 0, F, 5, A, 3, and C are used as test pattern data values); the Row Address Count (which selects the row or word address of the selected memory); and the Level Address Count (which selects which associativity level to choose of the 4 way set associative memories). These sequencers are shown in table form below:

| #of flip flops | Value of count | Name of Sequencer | Count Direction |
|---|---|---|---|
| 4 bit | count to 12 | test address counter | up only |
| 2 bit | count to 4 | longword counter | up/down |
| 3 bit | count to 8 | pattern counter | continuous |
| 1 bit | count to 2 | turnaround hold counter | continuous |
| 7 bit | count to 128 | row address counter | up/down |
| 2 bit | count to 4 | level associativity counter | up/down |
| 3 bit | count to 8 | read-stall-write counter | continuous |

The generator 26 of FIG. 1 contains the test sequencers listed in the previous table. The table above illustrates that seven sequencers are used to perform the complete BIST test in a preferred form on a preferred data processor. The 4-bit test address counter is used to select one of twelve memory portions or memory sections within the data processor. If multiple longwords need to be written, the 2 bit longword counter is used. In some memories multiple longwords are stored in each bank of a set associate memory. Eight test patterns 0, F, 5, A, 3, C, 3, C (in hexadecimal) are written to each memory location within the data processor. The 3-bit pattern counter cycles the test patterns properly. The 7-bit row address counter selects a row of memory within a memory portion which is to be tested. The 2-bit level associativity counter is used to test up to a 4×1 set associate cache memory or a like structured memory. The 3-bit read-stall-write counter cycles through the eight steps required to perform a test of a single memory location using a single hexadecimal test pattern. As indicated above, longwords are tested but only 4-bit test patterns are generated. To arrive at a longword value, each 4-bit test pattern (e.g., C in hexadecimal) is duplicated into eight parallel sets to form a 32-bit value (e.g., CCCCCCCC in hexadecimal).

The above listed sequencers will provide the exact sequence for testing the plurality of different memories in the following order:

| Internal Test Address | Memory Name | Rows | Levels | Long-words | Word Bit Length |
|---|---|---|---|---|---|
| 0 = 0000 | ICU TLB Directory | 16 | 4 | 1 | 32 |
| 1 = 0001 | ICU TLB Storage Array | 16 | 4 | 1 | 32 |
| 2 = 0010 | ICU IDR Cache Directory Array | 128 | 4 | 1 | 32 |
| 3 = 0011 | ICU ICA Cache Directory Array | 128 | 4 | 4 | 32 |
| 4 = 0100 | OCU TLB Directory | 16 | 4 | 1 | 32 |
| 5 = 0101 | OCU TLB Storage Array | 16 | 4 | 1 | 32 |
| 6 = 0110 | OCU IDR Cache Directory Array | 128 | 4 | 1 | 32 |
| 7 = 0111 | OCU ICA Cache Directory Array | 128 | 4 | 4 | 32 |
| 8 = 1000 | BCA Directory Array Lower 32 bits | 64 | 4 | 1 | 41 |
| 9 = 1001 | BCA Directory Array Upper 32 bits | 64 | 4 | 1 | 41 |
| 10 = 1010 | BCA Storage Array Upper 32 bits | 64 | 4 | 1 | 41 |
| 11 = 1011 | BCA Storage Array Upper 32 bits | 64 | 4 | 4 | 41 |

In the above table, ICU=Instruction Cache Unit, TLB= Translation Look-aside Buffer, IDR=Instruction Directory, ICA=Instruction Cache Array, OCU=Operand Cache Unit, and BCA=Branch Cache Array.

The table above illustrates that, in a preferred form, ten memories are tested wherein two of the ten memories must be tested in two separate parts due to the fact that they are wider than the BIST's 32-bit testing ability. Therefore, twelve total tests are required to test ten total memories within a data processor, given the information of the above table.

In the above table, all memories have 32-bit long data words except for the BCA memories which have 41 bit long data words. The BCA is tested as the right 32 bits (the-32 bits from the LSB towards the MSB) and the left 32 bits (the 32-bits from the MSB towards the LSB) with the overlapping bits being verified in both test sequences.

Once the test pattern is formed, it must be applied (i.e., transmitted) to the memories. This is accomplished by creating a 32-bit data quantity made of address information and the pattern data (which is made by replicating the 4 bit pattern values repeatedly to fill the 32-bit quantity as indicated above). The 32-bit mixed data and address pattern is then directly placed on a special 32-bit bi-directional test bus 31. The bus 31 is special in that it allows the pattern to be applied to the memories 12–14 through the storage devices 16, 17, 42, and 43 and allows the response data to return since the application and return data are separated in time by the pipelined data processor bus. In other words, the bi-directional test bus 31 is time multiplexed wherein a first time interval sends data to the memories 12–14 and a second time interval, different from the first time interval, receives data from the memories 12–14.

The 32 bit test pattern is first transmitted across the bi-directional bus 31 to the input side of the 2nd and 4th storage devices (17 and 42, respectively). The tri-state buffers 28, 29, 39, and 41, in FIG. 1, provide proper routing of test data via one or more control signals. The storage devices 16, 17, 42, and 43 are each 32-bit registers. In other words, two banks of 32 input interface registers and 32 output interface registers is made with a first bank consisting of the devices 42 and 43 and a second bank consisting of the devices 16 and 17. The first bank (devices 42 and 43) is used to interface address information to the memories 12–14 and the second bank (devices 16 and 17) is used to interface data to the memories 13–14. To prevent functional performance degradation of the internal address and data busses which occurs by adding the extra capacitive loading of the test bi-directional bus 31 directly to the data and address busses themselves, the storage devices 17 and 42 that were used were chosen from a class of D flip-flops known as multiplexed-scan registers. This type of register has two input pins, D and SDI, which are equal in function but the one chosen to be applied depends on the value of the multiplexer select line SE (scan shift enable). When the BIST mode was initially established the SE signal to the MUX 106 is set to select SDI for the duration of the BIST mode. The D flip-flop 110 is also a multiplexed-scan register, but is not illustrated in FIG. 3 as a multiplexed-scan register. The D flip-flop 110 has two separate outputs wherein the two outputs are logically equivalent but are isolated for each other in terms of both impedance and capacitance.

The bi-directional test bus 31 is connected to the 2nd storage device 17, which are the 32 data processor data bus input registers, through their SDI input ports, and passes the test pattern through the register and to the data processor data bus 44 when the control signal allows the tristatable driver 28 to pass the information. At the same time the test bus 31 is also connected to the 4th storage device 42 and the same test pattern is transferred to the data processor address bus 48 through the 32 SDI connections in the address bus input registers (i.e., device 42) by enabling the tristatable driver 39 with control signal 37.

The whole 32 bit test pattern word is transferred from the bi-directional test bus 31 to the data processor data bus 44 after one data processor clock cycle, and is transferred to a selected memory 32-bit data input register 18 or 21 or 23 on the next rising edge of the clock. These registers are part of the local memory data path from the CPU 15 and are reconfigured by multiplexers to get their data from the data processor data bus when the BIST mode is established. The overall effect of this architecture is to emulate the application of data at the data pins and to pass this data to a selected memory through a two stage pipeline.

The address part of the test pattern is also following a similar route. The same 32 bit test pattern is applied to the data processor address bus through the SDI pin of the 4th storage device 42 on the first data processor clock cycle (rising edge) and is applied the memory select logic through the functional memory controller. The bits of the test pattern that represent address information are recognized and are applied so that the selected memory captures the data applied by the data bus into the addressed bank and row location. The overall effect is to select the proper addressed memory locations at the same time the data arrives at the memory and all from the same test pattern that sources from the pattern generator as a single 32-bit quantity.

The data processor 10 contains many memories (see table 2) of varying row depths, word bit widths, and even banks (known as longwords). All of these memories are 4 way set associative by having 4 levels. The BIST can test all of these memories because of the way it generates and applies the test pattern and because of one generalizing assumption, that all data words and therefore, test patterns would be limited to 32 bits in width. By making this assumption, it was then possible to establish that the 10 resident embedded memories would be addressed as 12 separate 32-bit memories. The flexibility of handling different sized memories is then transferred into the addressing scheme instead of making the test pattern change bit widths.

The BIST relies on testing each one of these memories at a time by applying specific data in a specific order (which is designed to detect maximum fault coverage). The proper memories, banks, and memory locations are selected by directly applying the address as part of the test pattern to the address bus and to the functional memory controller. The memory controller conducts the same function that it does during functional mode with one exception, the memory which is chosen is different. Which of the 12 memories is chosen by a 4-bit test address supplied as part of the test pattern and is directly translated to the specific memory because of the BIST mode control signal 38 from the test controller 11.

When the address has been selected and the data has been applied to the selected memory (for example, memory 12) by placing the data on the output of the 32 bit register 18, the data is written into the memory 12. After the data is stored by the memory, a read is requested (in the identical fashion in which the write was conducted) which will cause the stored data to be applied to the D pin of the 32 bit memory data output register 19 or 22 or 24 (register 19 is used when memory 12 is being tested). On the rising edge of the data processor clock the data will be captured by this register and the read data will appear on the return path of the data processor data bus 47.

On the second rising edge of the data processor clock, the read data will be captured by the 1st storage device 16 which is the functional 32-bit data bus output register. This register is also a multiplexed scan D flip-flop, but it is not placed in the scan mode as the input registers are (the SE pin is not asserted). In the case of the output register, the D flip-flops used have two identical outputs, Q and SDO. When data is clocked into the D pin it appears simultaneously on the Q and SDO pins. These pins are separated internally to the D flip-flop so that no loading occurs to the functional part of the data processor data bus pin interface 34 due to the inclusion of the bi-directional test bus 31.

The test controller 11, anticipating the returned read data on the pipelined data bus 47 to be clocked into the 1st storage device 16 and to be placed onto the bi-directional test bus 31, will change the sense of the control signal to the tristate driver 28 and 29 so that the data is now routed as an input to the test controller. Once the read data is resident on the bi-directional data bus 31, the memory verification element 27, which is a multiple parallel input linear feedback shift register signature analyzer, captures the read data and compresses it with the compressed data that is already resident in the signature analyzer. The signature analyzer is controlled in such a way as to only capture and compress the read data when it arrives, instead of cycling every clock cycle as most signature analyzers do. This prevents the signature analyzer from capturing the test pattern created by the pattern generator 26 directly when it is created.

The signature analyzer itself is a 34-bit register with a parallel connection of the 32 bi-directional test bus bits directly to the D input pins of each of the upper 32-bits through an exclusive- or gate which also factors the output of the previous bit. For example the input to bit number 30 in the 34 bit register is the Exclusive-Or of the 28th bit of the test bi-directional bus and the 31st output bit of the signature register. The signature analyzer also compresses the data each time it is clocked by incorporating a feedback function. In this case, the specific function is the maximal polynomial (a maximal polynomial is one guaranteed to clock the register to all $2^n$ states if the input data is held at 0):

$$2^{34}+2^{27}+2^2+2^1 2^0$$

The above number represents a large prime number greater than $1.71 \times 10^{10}$. This value is implemented by taking the Q outputs from bits 27, 2, 1 and 0 and Exclusive-Or'ing them together and feeding them into the first input bit, number 33 (the register can be viewed as 34 contiguous bits from left to right numbered 33 to 0, with the input on the left side at bit number 33). This type of signature analyzer can be viewed as a shift right divide circuit that divides by the numerical value of the polynomial and after each clocking leaves the remainder of the division in the register. Even though the bi-directional data bus is only 32-bits wide, the signature register is 34-bits wide to provide some protection from aliasing (the effect that two errors will somehow cancel each other out and cause the analyzer to come up with the same remainder equivalent to a good circuit).

This single signature analyzer circuit is used for the whole BIST sequence and captures the response from all memories. The signature or remainder value is fully repeatable and so stopping the BIST at a particular clock cycle, for multiple invocations of BIST, and therefore, repeatedly stopping at a particular point in the BIST sequence will always produce an identical response. This allows partial signatures to be accessed to determine which memory of the plurality of memories 12–14 failed. This means that the detection of faults and the verification of the memories is an ongoing incremental operation. Each time the signature analyzer clocks, it is recording the verification of a memory location, where verification means that the memory has correctly stored, during a write cycle, a particular data pattern and that pattern has not been corrupted due to a fault in the memory or the control logic. Verification is accomplished when the correct expected data has been captured and compressed into the signature analyzer.

In general, a signature analyzer stores a group of history bits whose value determines whether or not any previous event resulted in failure. If the history value has been modified twenty times, then the history bits have kept track of twenty independent past data occurrences. Every time the same data path and data values are used, the same history bits should result after the twenty iterations. Therefore if the final history value is not what is expected or is not consistent with previous iterations, then an error has occurred in at lest one of the twenty data occurrences.

Figure 4:
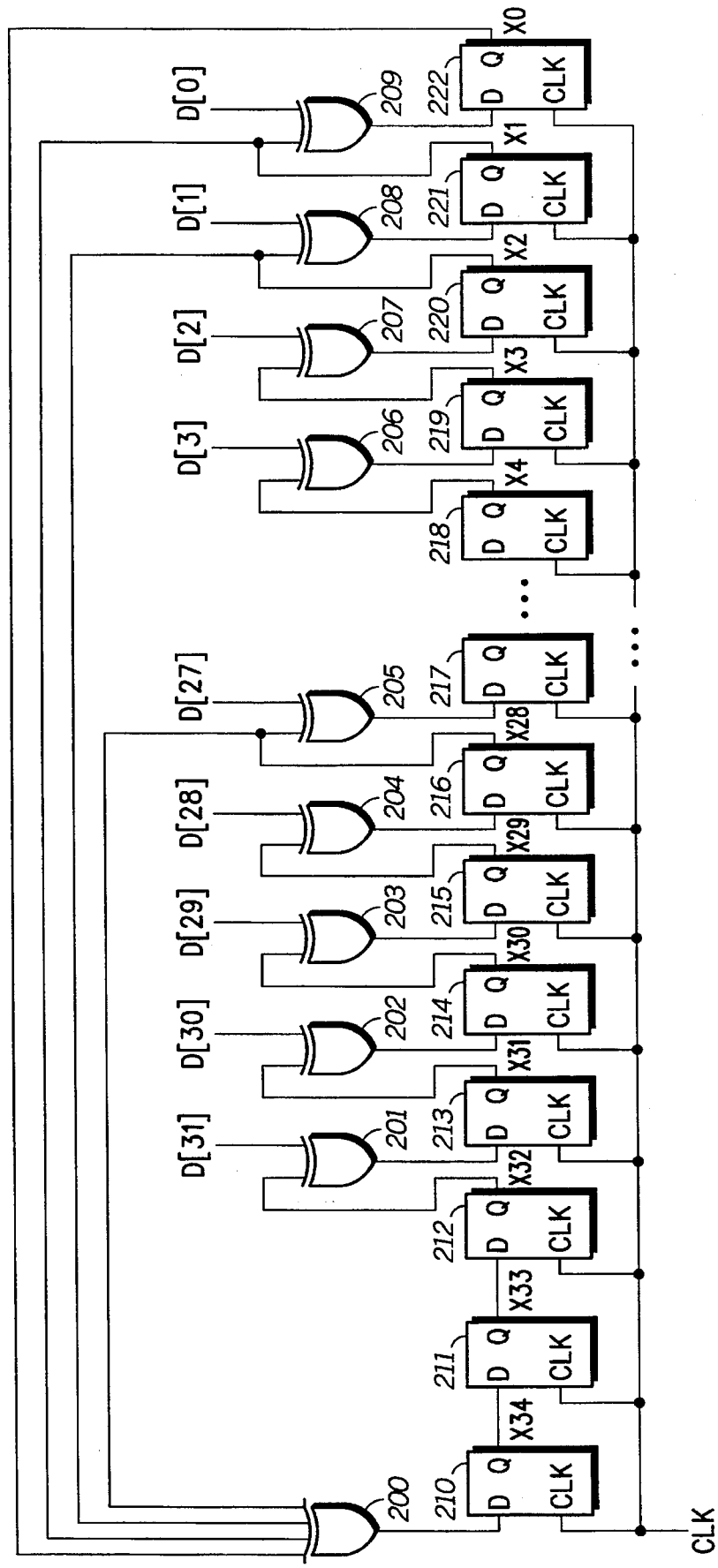
FIG. 4 illustrates, in a block diagram, a more detailed diagram of the memory verification element of FIG. 1, in accordance with the present invention.

The 34-bit parallel-input (type II) signature analyzer discussed above is illustrated in FIG. 4. In FIG. 4, exclusive or (XOR) gates 200 through 209 are illustrated along with thirteen D flip-flops 210 through 222. The D flip-flops 210–222 are used to represent a total of thirty-four flip-flops although not all 34 flip-flops could be easily illustrated in one figure. Each D flip-flop contains a decimal number which identifies its bit position in the signature analyzer. The outputs of the D flip-flops are labeled as X# wherein # equals the D flip-flop number. The Q output of the flip-flops in FIG. 4 are used to externally transmit the contents of the signature analyzer.

The D flip-flops 210–222 are initially pre-loaded with a predetermined non-zero value before signature analysis takes place. This predetermined non-zero value is the first set of history bits. New bits of data (i.e., D[31], D[30], etc.) are received via the bi-directional bus of FIG. 1, and the new bits of data are illustrated as inputs in FIG. 4. It is the XOR gates 200 through 209 that provide one or more feedback paths which change the current history bits into new history bits. These new history bits are formed via the remainder of a divide by a large prime number (via the XOR gates). The design and placement of the XOR gates 201 through 209 ensure that divide can result in all possible $2^n$ combinations of bit values wherein n=the number of bits in the signature analyzer. FIG. 4 is provided to illustrate one possible signature analyzer although others (such as a serial 34-bit type II signature analyzer or other connections of XOR gates) may easily be used. Designers must be careful not to zero out a signature analyzer as discussed above.

In FIG. 4, n equals 34 and $2^n$ is equal to 17,179,869,184. The primitive or maximum polynomial (i.e., large prime number) is X34+X27+x2+x1+x0 which equals 8,724,152,327.

The actual application of BIST reads and writes to particular memories, banks, and word locations, and the data pattern written to these locations has been organized and sequenced in such a way as to get the maximum fault detection for the physical placement of the memory cells. This means that the data patterns 0, F, 5, A, 3, and C have been chosen and applied in a particular sequence to memory locations that have also been addressed in a particular sequence to most aggravate and identify common memory faults such as individual memory bits shorted together that are physically next to each other within a word; bits shorted together within a column; random bits shorted to each other; random bits that are stuck at a logic value of 1 or 0; address lines that select memory locations have shorts to other address lines; address lines that are stuck at logic values of 1 or 0; and memory cell data retention since the BIST can be run at the rated data processor clock frequency.

The sequence or algorithm applied in this case was to select one memory, then to select one bank of that memory, and then to start at the first of the memory levels at the first (lowest row address) memory location. The first data pattern applied is all 0's. Each memory location goes through the read-stall-stall-sample-stall-write-stall sequence, where read is a request for the memory to send the stored data to the signature analyzer, stall is a wait cycle for the pipelined data path to move the data without conflict from other data, sample is the one cycle that the signature analyzer captures the data, and write is the request for the pattern generated by the pattern generator to be stored into the memory. During the application of the 0 data pattern, the signature analyzer is disabled since the pre-existing data in the memories is unknown and therefore non-deterministic. After writing a logic 0 (32-bit Hex) into the first memory location, the memory level is incremented and the next level's first row address location is written to. This continues until the first row address location is written for all memory levels. The row address is then incremented to the second memory location. This process repeats until the entire memory and all memory levels are full of 0's. The very last memory location for the first memory level is then held and the data pattern is changed to all 1's while the signature analyzer is enabled. When the read-stall-stall-sample-stall-write-stall sequence is applied, it has the operational effect of reading the existing data (a 0) and writing the complement (a 1).

The overall algorithm is that of marching down the memory (low to high row addresses) while writing a 0, then marching up the memory while reading the 0 and writing the complement 1; then marching down the memory—read the 1—write the 5; marching up—read the 5—write the A; marching down—read the A—write the 3; marching up—read the 3—write the C; marching down—write the 3—read the C; marching up—write the C—read the 3.

Once a whole memory bank is completed, then a new bank is selected, if there is more than one bank. If not, then the next memory is selected. If a new memory is selected, then some stall cycles are added to allow any selection logic to settle before beginning the actual read-write sequence. This sequence of events repeats itself until the all memories have been verified. In a preferred form, the test time required to conduct BIST for the set of memories in the second table listed above is:

| | |
|---|---|
| tadr 0 --> | 3,584 clock cycles |
| stall 3 --> | 3 clock cycles |
| tadr 1 --> | 3,584 clock cycles |
| stall 3 --> | 3 clock cycles |
| tadr 2 --> | 28,672 clock cycles |
| stall 3 --> | 3 clock cycles |
| tadr 3 --> | 114,688 clock cycles |
| stall 3 --> | 3 clock cycles |
| tadr 4 --> | 3,584 clock cycles |
| stall 3 --> | 3 clock cycles |
| tadr 5 --> | 3,584 clock cycles |
| stall 3 --> | 3 clock cycles |
| tadr 6 --> | 28,672 clock cycles |
| stall 3 --> | 3 clock cycles |
| tadr 7 --> | 114,688 clock cycles |
| stall 3 --> | 3 clock cycles |
| tadr 8 --> | 14,336 clock cycles |
| stall 3 --> | 3 clock cycles |
| tadr 9 --> | 14,336 clock cycles |
| stall 3 --> | 3 clock cycles |
| tadr A --> | 14,336 clock cycles |
| stall 3 --> | 3 clock cycles |
| tadr B --> | 14,336 clock cycles |
| Total: | 318,433 total clock cycles |

Wherein tadr #=test address #; wherein #=1 thru B in hex.

For example, at a 66 Mhz operational frequency, the above listed clock cycles translates to a BIST time of 4.82 milliseconds.

When the whole BIST is completed, a final signature exists in the memory verification element 27 and the pattern generator 26 indicates internally that it has created its last test pattern. This causes the BIST done pin 32 to transition, which alerts the user of the data processor that the test is complete (without the user having to count clock cycles). On the clock cycle after the BIST done pin 32 transitions, a BIST good pin presents a pass/fail status that is assessed internal to the data processor by conducting a compare between the final signature value and a predetermined designed-in value. On subsequent clock cycles after the pass/fail status pin transitions, the signature itself is presented serially one bit at a time. The signature can also be transferred to an internal status register at any time during the sequence, and this signature can be viewed by serially presenting it to another output pin (this process is referred to as a accessing a partial signature).

The many unique features documented here, such as the ability to invoke the BIST with a single pin and the clock while not requiring any values to be present on any other input signal pins; not loading down or causing any performance degradation to the functional input and output data processor busses; being able to conduct a full manufacturing defect quality type of test with real data; using parts of the functional memory architecture; and controlling and conducting all of this testing with a minimum hardware impact single test controller that uses only 22 flip-flops for pattern generation and 34 flip-flops for memory verification, make this architecture ideal for many test environments. The above may also be implemented at wafer-level testing stages to predetermine faulty integrated circuits before incurring the cost of packaging the faulty circuits.

The BIST provides a full manufacturing level confidence test that has the ability to identify the same defects found in full manufacturing memory characterization. This is possible because real manufacturing type data patterns are applied to the memories through part of the real operational architecture in a manner consistent to the real conditions under which the memories will be used (as opposed to other test methods which throw random or non-realistic patterns in random non-realistic addressing orders to a memory). The testing taught herein can also be applied at the rated data processor operating frequency.

The minimum interface allows burn-in testing within ovens that have limited I/O and removes the requirement of having extra ROM code in the test board placed in the oven to operate the data processor functionally. Actually, the minimum interface of a single invoke pin, the clock, and the response of a done and a pass/fail, make this architecture ideal for not only wafer level (prepackaging) confidence testing but also burn-in testing since the pins and clocks in many cases may all be connected in parallel together on the wafer, all power and ground can be applied by a metal bus that can be removed at dicing, and a probe point can interrogate the good pass/fail pins.

The ability to stop the BIST and capture the partial signature is also a powerful diagnostic tool. If the BIST test fails, it can be run to known sequence points and interrogated to see which memory, memory bank, and even memory location provided the erroneous incremental data (referred to herein as partial signature testing).

The fact that the circuitry has minimum hardware impact and does not cause degradation to the functional circuitry allows it to non-intrusively coexist with the functional circuitry, take up little integrated circuit die area, consume less power and generally meet most common semiconductor design and implementation concerns.

FIG. 2. illustrates a flow diagram that may be used to implement the present invention. At a step 61, the test pattern generator generates a test pattern for the plurality of memories. This is accomplished by knowing the particulars for all of the memories and knowing the address space for each one, and making an assumption such as all memory word lengths will be no longer than 32-bits. Then, when the test pattern is created it has a known size (for this example 32-bits), the specific bits that control the addressing within the allowed 32-bits can be set directly from a sub-sequencer for each address class (i.e., which memory address, which bank or longword address, which row or word address, and which associativity level address), while all other bits are filled with the data pattern.

At a step 62, this test pattern is transmitted to one of the memories in a pipelined manner. This means that the example 32-bit test pattern is applied simultaneously to the data and the address busses that link the test controller to the memories and that these busses have at least one sequential (clocked) device between the source of the pattern and the memory. For this to work the data must be applied only when there is no competing arbitration for the bi-directional part of the bus. This requires that stall cycles be added to the sequence so that a previous read request that sends data to the test controller does not contend with a write operation that is trying to send data to the memory from the test controller.

At a step 63, the data portion of the test pattern is stored in memory in a particular 32-bit word location within a single associativity level, within a single longword, within a single memory, while the address portion of the test pattern selected the memory location that the data portion was stored or "written" to.

At a step 64, the data that was stored is then requested to be returned to the test controller by the same mechanism that stored the pattern (by placing an address on the address bus and invoking a control signal that asks the memory to read the addressed location). This information is returned to the test controller by a similar pipeline in that the data leaving the memory location must pass through at least one sequential element on the way back to the test controller, and contention is avoided on the bi-directional bus by using stall cycles.

At a step 65, the integrity of the memory is verified by capturing the read data from the memory and compressing it into a known binary data value within a signature analyzer. This data value is incrementally calculated and keeps a record of all requested memory reads.

At a step 67, the memory verification has failed due to bad read data being read into the signature analyzer. This immediately produces a wrong data value that will corrupt all future incremental signatures from the read values. Even though the testing may continue, the verification has already failed and logged the error. When the sequence is over, the final signature will be compared to a fixed and calculated value which will cause a single pin, that is designed to produce a pass/fail indication, that the test has failed.

At a step 68, the memory location that was read has been captured by the signature analyzer and has produced a correct incremental signature. If the whole memory has not been verified then the next location within the memory must be tested. This results in moving on to step 69 which repeats the entire sequence through step 68, but with the test pattern changed to include the new address and for full verification, new pattern data (each memory location is verified multiple times with different pattern data—0, F, 5, A, 3, and C as discussed above). Multiple patterns are used to excite different classes of failures—for example—the 0000 pattern will identify that all bits are not stuck-at logic level 1 and will show that none of the bits are shorted to other memory locations that may contain 1's, whereas the 0101 pattern will show that no adjacent bits are shorted to each other, etc..

When a whole memory that includes all banks, associativity levels, and words has been verified then the sequence moves on to a step 71, "have all memories been tested". This step identifies that there are a plurality of memories to test. If there is another memory that has not been verified, then the sequence move to step 72, which is essentially a repeat of step 61. A step 73 is used to generate/indicate results such as pass/fail bit(s) and BIST done bit(s).

This entire cycle continues until all of the pluralities of memories have been tested fully by reading the data written to each memory location for each associativity level and longword while marching up and down the row addresses while changing the patterns. When the test is complete, and if the memories have been verified as good, then the pass/fail pin will transition to indicate that the test has passed.

The present invention provides a method and apparatus for internally testing a plurality of memory within a data processor. With such a method and apparatus, the data processor can support a plurality of different embedded (not easily accessible to the data processor externals) memories and can incorporate a high confidence testing scheme that has a minimum performance and area impact to the functional data processor.

The invention described here can be compared to other known and documented methods of providing internal test to memories embedded within data processors. These other methods view each memory as a standalone item with its own test controller, pattern generator, and verification device all placed in close proximity to the memory. This has the direct disadvantage of negatively affecting the performance of the memory and has a high physical implementation area overhead. These problems are solved by the implementation of the invention by having only one separate minimum implementation controller and by interfacing the data, address, and control data to the memories in the non-intrusive fashion of insertion of the test pattern through the functional bus input and output registers.

These individual pattern generators are usually based on some form of Linear Feedback Shift Register (LFSR) to provide data and some form of counter or LFSR to allow the individual memory to change word addresses. To minimize the impact of wrapping the test structure around each memory (by inserting them directly in the data and address paths to and from the memory), most of these types of designs use random or pseudo-random patterns and address generators that have a lesser impact (but not as minimum as a single central controller). This allows standard pre-designed LFSRs and Multiple Input Signature Analyzers (MISRs) to be placed next to each memory directly in the bus path, regardless of the memory's size. This also means that multiple banks and multiple levels of association are treated as whole complete separate memories, or are all tested identically at the same time, if possible (in most cases all multiple banks are written at the same time which would destroy any separated test data, and only one bank can be viewed at a time which would hide or mask the results of the test).

The direct result of conducting single memory LFSR Pseudo-Random Pattern Generated (PRPG) Address and Data testing is that this kind of testing applies constantly varying data to randomly varying addresses and a statistical type of analysis or argument is used to judge the confidence level. These tests are not designed to provide directed data in a known addressing sequence that intentionally exercises the memory based on its physical and topological layout to maximize the fault detection, whereas the documented method is (it would add a great level of complication and area overhead to allow the LFSR to receive different start values (SEEDs), different clock cycle lengths, and to apply different polynomials to produce a sequence tailored to the physicalness of the memory).

Another problem with the distributed individual memory test scheme that is commonly used in industry today, is that any change to the physical implementation of the memory or its control logic also requires a corresponding change to the closely coupled test logic. For example, if a design change causes the memory to add address space or to change the data word length, then significant redesign of the test logic is required. For example, the LFSR or counter that supplies the Address and/or the data word would have to change lengths (add or subtract at least one bit), and if the LFSR length changes, then the polynomial has to change, which means moving all of the Exclusive-Or feedback terms on the register.

With the centralized controller in the invention, the address or data word generator is designed to handle the single largest memory. If the size of any individual memory changes, then it is a simple decode term that needs to be changed in one place within the single test controller to count to extra addresses or change the width of the memory data word. To change the size of the memory verification element is also a single area change and this change encompasses all of the plurality of memories within the data processor.

The design of FIG. 1 is extremely cost efficient when a plurality of memories is used within the data processor. The single memory LFSR method commonly used will require changing the individual PRPG and MISR used with each memory (multiple fixes) whereas the described invention has only one pattern generator, one addresser, and one verification device for the whole data processor. A change in only a single area can accomplish many modifications that encompass all of the plurality of memories and keep the high level of fault detection required (changes to individual pattern generation LFSR's may result in different pattern sequences that do not give the same amount of statistical fault coverage).

The ability to invoke the process by a single pin and needing only to supply the clock with all other input pins at a don't care level, and concluding the test with a pass/fail and presenting the signature, allows for use of this invention within constrained environmental chambers and also allows for wafer level confidence and burn-in testing.

This invention also uses real portions of the memory architecture and applies patterns that are equivalent to real data, and applies addresses in a directed manner, which gives a real confidence level and identifies more faults than the other methods that use test-only circuitry wrapped around a memory and apply random or pseudo-random data and addressing schemes.

Figure 5:
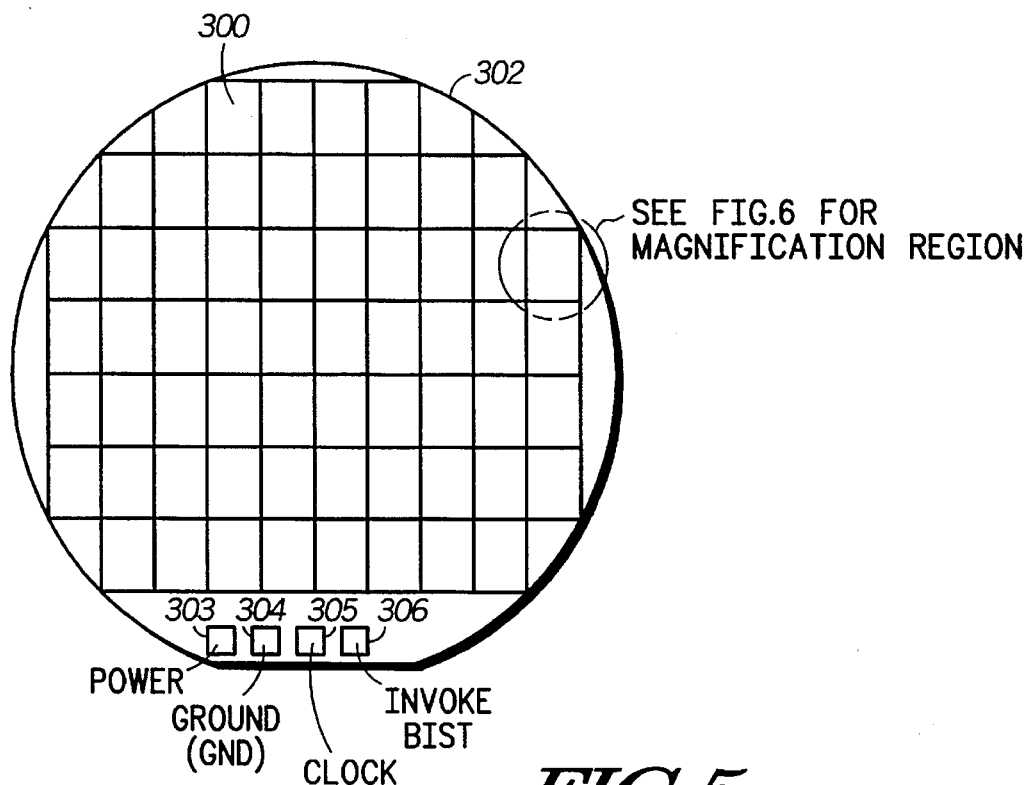
FIG. 5 illustrates, in a top-down perspective, a wafer having several integrated circuits which may be wafer tested using an internal BIST in accordance with the present invention.

FIG. 5 illustrates a semiconductor integrated circuit wafer 302 having one or more integrated circuits 300 (only one of which is labeled in FIG. 5). FIG. 5 illustrates many integrated circuits 300 on the wafer 302. Wafer 302 contains one or more probe points referred to as probe points 303, 304, 305, and 306. Probe point 303 is connected to a power supply. Probe point 304 receives a ground signal. Probe point 305 receives a clock signal. Probe point 306 receives an invoke BIST signal. The probe points 303–306 are coupled to each of the integrated circuits 300 via conductive interconnects routed through the scribe lines (spaces between chips) of the wafer 302.

Figure 6:
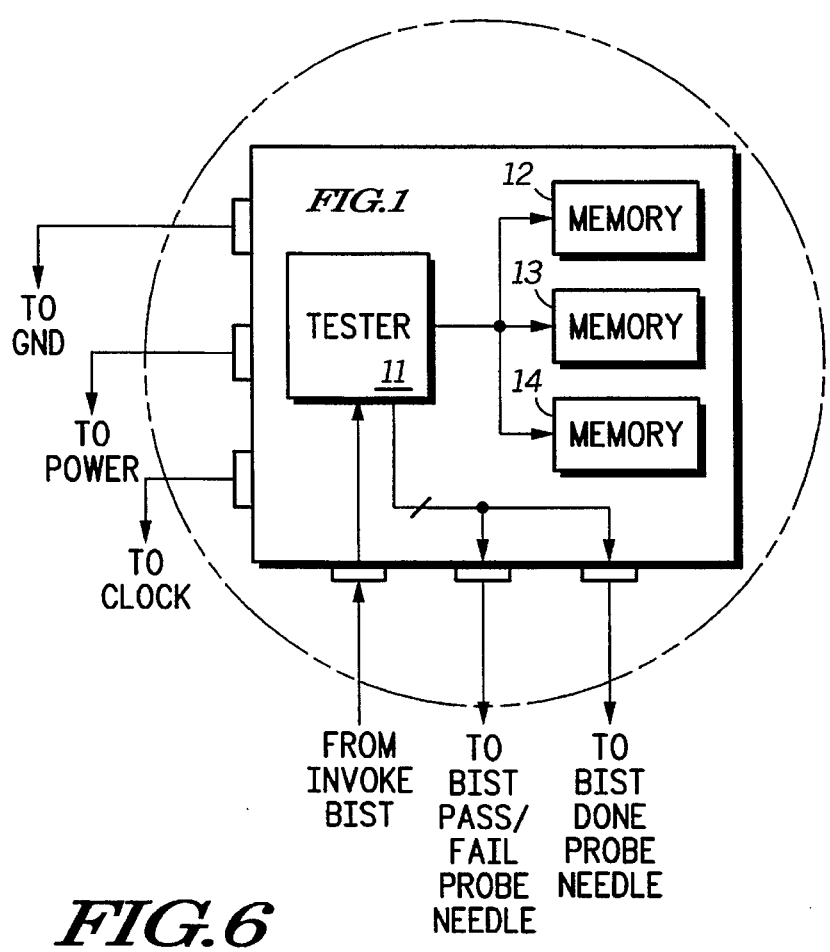
FIG. 6 illustrates, in a top down perspective, a magnified portion of FIG. 5.

FIG. 6 illustrates a magnified integrated circuit 300a for FIG. 5 wherein the circuit 300a contains the circuit of FIG. 1. In general, the circuits 300 contain a tester 11, and a plurality of memories 12–14. External pin pads of the integrated circuit 300 are coupled to the scribe line interconnects to provide power, ground, clock(s), and the invoke BIST signals as illustrated. Pads on the integrated circuit which indicate logically when the BIST test is done and whether the specific integrated circuit passed or failed BIST testing. These BIST done and BIST pass/fail signals may be probed individually at each integrated circuit location or may be globally routed and probed at a centralized location anywhere on the wafer 300. Several groups of centralized BIST done and BIST pass/fail locations may be used (for example, 4 chips at a time may be routed to a central area so probe needles are placed in one general area to cover signals from four chips). By invoking the test and monitoring the BIST pass/fail probe needles and the BIST done probe needles for each integrated circuit 300, a tester can determine which integrated circuits are functional and which integrated circuits are not functional according to the BIST criterion. Packaging costs may be saved by discarding non-functional BIST-discovered die before scribing the wafer 300. Scribing of the wafer destroys all of the scribe line interconnects so that the integrated circuits are disconnected and may be packaged.

In one form, the signature analyzer may be designed in such a way as to indicate the exact cycle in time when BIST failure occurs. This can be used to prematurely terminate the BIST test and identify the particular failing clock cycle/memory location.

While the present invention has been shown and described with reference to specific embodiments, further modifications and improvements will occur to those skilled in the art. For example, the single controller unit can be made generically with the number and sizes and testing order of the plurality of memories applied as programmable constants input into configuration registers or stored in a ROM (read only memory). The controller itself can be altered easily to handle different variations of the plurality of memories. This alteration encompasses handling different numbers of memories, multiple different bus widths, multiple different word widths, multiple different number of banks, multiple different N×M associativity levels (where N is an integer of 1 or greater as is M), and any combination of the above.

Another alteration that can be considered is the ability to repeat tests on any selected memory, in the plurality of memories test sequence, multiple times contiguously or in different places in the overall sequence (i.e. test the Operand Cache as the 2nd memory and retest it again as the 4th memory tested after testing the Integer Cache as the 3rd memory to see if operating the Integer Cache in any way affects the integrity of the Operand Cache).

The actual applied test data patterns themselves can be modified to apply a wider variety (i.e. not just 0, F, 5, A, 3, and C, but any other binary group of bits that would target particular fault classes (such as 6=0110 and 9=1001) and in any particular order. The number of patterns applied can be changed from the eight described in the invention to an number needed to achieve the desired coverage (if it takes only 2 patterns such as 3 and C or if it takes 12 patterns such as 0, F, 5, A, 3, C, 6, 9, 1, 7, 2, and 8) and the basis can also be altered (i.e. using a group of 3 bits for octal patterns or 8 bits to present a pattern that repeats on other than 4 bit boundaries such as 01011010 and the complement 10100101).

Another area of interest will be the actual addressing order applied to any given memory, group of memories, banks of memories, or associativity levels of memories. Instead of marching up and down a single memory, it only takes a change in the priority of the sequencers to verify the first location of each longword and then continue on to the second location of each longword.

The most probable change that can occur has to do with the actual application order of the read-write sequence and the need for stall cycles. The controller can be easily modified to handle different depths of pipelining which will change the number and placement of stall cycles. The physical layout of the memory, and the particular fault driving mechanisms inherent to the process used, will also require the read-write sequence to change to write-read or read-write-read or any combination of reads and writes to verify that an individual memory cell can capture and hold data, store it for a measured length of time (which may be indefinite), and can produce the stored data to a measuring or observation point when requested.

In addition to verifying the memories of an integrated circuit, other associated logic such as compare logic, address decoding, comparators, write-enables, and the like are verified.

All of these changes can be applied individually or in any combination up to the total described and will not significantly change the advantages presented with this invention as it will still be a single test controller with a unique and novel way of transmitting the test pattern to the functional part of the memory architecture and into the plurality of memories, and returning the data written as read requests of the memory to a verification device. All the changes mentioned here only differ in the size and execution order of the various parts, but not in the basic operation and goals of the invention. Memory testing is not limited to 4×1 set associative arrays but can be used to test N×1 set associative memory arrays wherein N is a finite integer greater than one. It is to be understood, therefore, that this invention is not limited to the particular forms shown and that it is intended in the appended claims to cover all modifications that do not depart from the spirit and scope of this invention.

What is claimed is:

1. A method for internally testing a plurality of embedded memories of a data processor, wherein the data processor is formed on a single integrated circuit and at least two of the plurality of embedded memories are different in both physical placement and number of memory, locations contained therein, the plurality of embedded memories residing within the single integrated circuit, the method comprising the steps of:

(a) generating, by an internal test controller of the data processor, a test pattern for testing the plurality of embedded memories, the test pattern having a plurality of bits;

(b) transmitting the plurality of bits of the test pattern in a parallel manner via at least one bus of the data processor to one embedded memory in the plurality of embedded memories, the at least one bus being internal to the single integrated circuit and having no direct connection to an environment external to the integrated circuit, the at least one bus being time multiplexed to be a functional bus that is used by the data processor to communicate information in a normal mode of operation and being a test bus that is used to transmit the plurality of bits of the test pattern in a test mode of operation;

(c) storing at least a portion of the test pattern within predetermined cells of the one embedded memory;

(d) reading, by the internal test controller, the at least a portion of the test pattern from the predetermined cells of the one embedded memory;

(e) verifying, by the internal test controller via the steps of reading and storing, that the one embedded memory is functioning properly, the verifying being performed by storing data in a verification storage element wherein the verification storage element has an input and an output wherein a feedback path is coupled between the input of the verification storage element and the output of the verification storage element so that the output of the verification storage element affects the input of the verification storage element; and changing the test pattern to a new test pattern and repeating steps (b) through (f) until no new test patterns are available.

2. The method of claim 1 further comprising the step of:
    reading, by the internal test controller, a binary value from the predetermined cells before the step of storing is performed.

3. The method of claim 1 wherein the step of storing at least a portion of the test pattern within predetermined cells of each embedded memory comprises:
    writing the at least a portion of the test pattern as at least one binary value selected from a group consisting of: 0000, 1111, 0011, 1100, 0101, and 1010.

4. The method of claim 1 wherein the at least one bus is a pipelined data bus, the method further comprising the step of:
    stalling the pipelined data bus before the step of storing.

5. The method of claim 1 wherein the step of transmitting the test pattern via at least one bus, comprises:
    transmitting the test pattern via a data bus internal to the data processor which has a pipelined structure wherein the test pattern is clocked through at least one intermediate storage location before being accessible by an embedded memory of the plurality of embedded memories.

6. The method of claim 1 wherein the step of transmitting the test pattern via at least one bus, comprises:
    transmitting, via an internal bi-directional bus coupled to the internal test controller and coupled to a first memory device, a data portion of the test pattern to the first memory device within the data processor, the first memory device being coupled to a data bus internal to the data processor, the data bus allowing the data portion of the test pattern which is stored in the first memory device to be transmitted to one of the memories in the plurality of memories.

7. The method of claim 6 wherein the step of reading comprises:
    sending embedded memory data from the plurality of embedded memories to a second memory device via a plurality of conductors, the second memory device being coupled to the internal bi-directional bus in order to provide the embedded memory data to the internal test controller.

8. The method of claim 7 wherein the steps of sending and transmitting comprise:
    selectively stalling the data bus in order to allow time multiplexing of the data bus so that the step of transmitting and sending may be performed through the internal bi-directional bus at different time intervals.

9. The method of claim 1 wherein the test pattern comprises an address portion and a data portion and the step of transmitting comprises:
    using an internal bi-directional bus to transfer the address portion to a first memory device, the first memory device being accessible by an address bus which is internal to the data processor; and
    using the internal bi-directional bus to transfer the data portion to a second memory device, the second memory device being accessible by a data bus which is internal to the data processor.

10. The method of claim 1 wherein one of the plurality of embedded memories is an N×1 set associative memory array, where N is a positive integer greater than zero, the N×1 set associative memory array having N separate banks of memory, the step of storing comprises:

storing the at least a portion of the test pattern within each memory location of each of the N separate banks of memory within the N×1 set associative memory array.

11. The method of claim 1 wherein one of the plurality of embedded memories is an N×1 set associative memory array, where N is a positive integer greater than zero, the N×1 set associative memory array having N separate banks of memory wherein each addressable location within the N separate banks of memory contains a plurality of data locations, the step of storing comprises:

storing the at least a portion of the test pattern within each data location of each addressable location of each of the N separate banks of memory.

12. The method of claim 1 wherein the at least one bus is a pipelined data bus and the method further comprising the step of:

stalling the pipelined data bus after the step of reading.

13. The method of claim 1 wherein the step of verifying comprises:

collecting data, read from the plurality of embedded memories via the step of reading, in an analyzer circuit, the analyzer circuit providing at least one bit external to the data processor to indicate whether the plurality of embedded memories within the data processor is operating in an error-free manner.

14. The method of claim 13 wherein the step of collecting data comprises:

collecting data in the analyzer circuit wherein the analyzer circuit stores an old plurality of history bits, the old plurality of history bits being logically combined with current data from the plurality of embedded memories to form an updated plurality of history bits wherein the updated plurality of history bits replaces the old plurality of history bits within the analyzer circuit.

15. The method of claim 13 wherein the step of collecting data comprises:

storing a history binary value within the analyzer circuit wherein the history binary value can be periodically checked to determine whether a single embedded memory within the plurality of embedded memories is properly operating.

16. The method of claim 1 further comprising the step of:

asserting a control signal external to the data processor to invoke the step of generating wherein all other non-clock signals accessible to the data processor from external to the data processor are ignored when a logic value of the control signal invokes the step of generating.

17. The method of claim 1 wherein the steps of reading and storing respectively comprise:

reading and storing through an internal bi-directional bus, the internal bi-directional bus being coupled between the internal test controller and the plurality of embedded memories, the internal bi-directional bus being coupled between the plurality of embedded memories and the test controller by circuitry which does not significantly increase either an impedance load or a capacitive load of an internal data bus of the data processor and an internal address bus of the data processor.

18. The method of claim 1 further comprising:

providing a plurality of addressing bits to the internal test controller of the data processor from external to the data processor, the plurality of addressing bits being used by the internal test controller to determine which embedded memory within the plurality of embedded memories is to be tested.

19. A method for internally testing a plurality of embedded memories of a data processor, wherein at least two of the plurality of embedded memories are different in that one embedded memory contains N memory locations and the other embedded memory contains M memory locations wherein N≠M, the data processor and the plurality of embedded memories being formed together in one integrated circuit, the method comprising the steps of:

a) generating, by an internal test controller of the data processor, a first test pattern in a set of test patterns for the plurality of embedded memories, the generating being performed by intercoupled counters and state machines within the internal test controller, the intercoupled counters and state machines generating both test data in the first test pattern and address data in the first test pattern, the address data being used to determine which memory in the plurality of embedded memories is to be tested;

b) transmitting the test data within the first test pattern of the set of test patterns via at least one bus of the data processor to a first embedded memory of the plurality of embedded memories identified by the address data of the first test pattern, the at least one bus being totally internal to the one integrated circuit and being electrically isolated from external to the one integrated circuit;

c) storing the data portion of the first test pattern within predetermined cells of the first embedded memory;

d) reading, by the internal test controller, the data portion from the predetermined cells of the first embedded memory via the at least one bus;

e) updating, by the internal test controller, a signature value which indicates an integrity of the first embedded memory with respect to the first test pattern, the signature value having an output and an input wherein the output logically affects the input via a feedback connection between the input and the output;

f) repeating steps (a) through (e) with the first embedded memory for remaining test patterns of the set of test patterns;

g) repeating steps (b) through (f) for remaining embedded memories of the plurality of memories;

h) providing an output in response to a final signature value which indicates whether the plurality of embedded memories are functioning properly.

20. The method of claim 19 wherein the steps of reading and storing respectively comprise:

reading and storing through an internal bi-directional bus, the internal bi-directional bus being coupled between the internal test controller and the plurality of embedded memories, the internal bi-directional bus being coupled between the plurality of embedded memories and the internal test controller by circuitry which does not significantly increase either an impedance load or a capacitive load of an internal data bus and an internal address bus of the data processor.

21. The method of claim 19 further comprising the step of:

reading, by the internal test controller, a binary value from the predetermined cells before the step of storing is performed.

22. The method of claim 19 wherein the step of transmitting the test pattern via at least one bus, comprises:

transmitting the first test pattern via a data bus which has a pipelined structure wherein the first test pattern is clocked through at least one intermediate storage location before being accessible by an embedded memory of the plurality of embedded memories.

23. The method of claim 19 wherein the step of transmitting the first test pattern via at least one bus, comprises:

transmitting, via an internal bi-directional bus coupled to the internal test controller, a data portion of the first test pattern to a first memory device within the data processor, the first memory device being accessible by a data bus internal to the data processor, the data bus being used to transfer the data portion of the first test pattern from the first memory device to an embedded memory within the plurality of embedded memories.

24. The method of claim 23 wherein the step of reading comprises:

sending embedded memory data from the plurality of embedded memories to a second memory device via a plurality of conductors, the second memory device being coupled to the internal bi-directional bus in order to provide the embedded memory data to the internal test controller.

25. The method of claim 24 wherein the steps of sending and transmitting comprise:

selectively stalling the data bus in order to allow time multiplexing of the data bus so that the transmitting and sending may be performed through the internal bi-directional bus at different time intervals.

26. The method of claim 19 wherein the at least one bus is a pipelined data bus and the method further comprising the step of:

stalling the pipelined data bus before the step of reading but after the step of storing.

27. The method of claim 19 wherein one of the plurality of embedded memories is an N×1 set associative memory array, where N is a positive integer greater than zero, the N×1 set associative memory array having N separate banks of memory, the step of storing comprises:

storing the at least a portion of the test pattern within each memory location of each of the N separate banks of memory within the N×1 set associative memory array.

28. The method of claim 19 wherein the step of updating comprises:

collecting data read from the plurality of embedded memories in an analyzer circuit, the analyzer circuit providing at least one bit external to the data processor to indicate whether the plurality of embedded memories within the data processor is operating in an error-free manner.

29. The method of claim 28 wherein the step of collecting data comprises:

collecting data in the analyzer circuit wherein the analyzer circuit stores an old plurality of history bits, the old plurality of history bits being logically combined with current data from the plurality of embedded memories to form an updated plurality of history bits wherein the updated plurality of history bits replaces the old plurality of history bits within the analyzer circuit.

30. An internal test controller of a data processor wherein the data processor includes a plurality of embedded memories, each of the data processor, the internal test controller, and the embedded memories are formed together in a single integrated circuit, the internal test controller comprising:

a test pattern generator that generates a test pattern for each embedded memory within the plurality of embedded memories and sequentially provides the test pattern to each embedded memory of the plurality of embedded memories via a bus internal to the single integrated circuit; and a memory verification element that is operably coupled to the test pattern generator via the bus internal to the single integrated circuit, the bus being used to conduct information from the test pattern generator and conduct information to the memory verification element in a time multiplexed manner, wherein the memory verification element verifies correct operation of the plurality of embedded memories by reading memory data from each embedded memory after writing the test pattern to the plurality of embedded memories, the memory data being provided to a storage element that changes from a first state to a second state in response to the memory data and the first state within the storage element, the storage element providing a signal that indicates whether the plurality of embedded memories are operating properly.

31. The internal test controller of claim 30 wherein the internal test controller selectively communicates at least a portion of the test pattern to a first storage device within the data processor though a bi-directional test bus, the first storage device being accessible to at least one of the plurality of embedded memories via an internal data bus of the data processor.

32. The internal test controller of claim 31 wherein the data processor selectively communicates data read from the at least one of the plurality of embedded memories to a second storage device, the second storage device being accessible to the test controller via the bi-directional test bus.

33. The internal test controller of claim 32 wherein the internal bi-directional bus allows data to be transferred from the internal test controller to the first storage device and selectively allows data to be transferred from the second storage device to the internal test controller in different time intervals.

34. The internal test controller of claim 31 wherein the first storage device has a first data path which allows data bits from external to the data processor to be communicated internal to the data processor, and a second data path isolated from the first data path in order to provide test data within the data processor in a manner which does not electrically load the first data path.

35. The internal test controller of claim 30 wherein the memory verification element is a signature analyzer which collects data read from the plurality of embedded memories, the signature analyzer processing the data read from the plurality of embedded controllers and providing at least one bit external to the data processor to indicate whether the plurality of embedded memories within the data processor is operating in an error-free manner.

36. The internal test controller of claim 30 wherein the memory verification element is a circuit which stores an old plurality of history bits, the old plurality of history bits being logically combined with current data read from the plurality of embedded memories to form an updated plurality of history bits wherein the updated plurality of history bits replaces the old plurality of history bits within the analyzer circuit.

37. The internal test controller of claim 30 wherein the data processor has a first external pin and a second external pin, the first external pin being used to identify when testing is complete, the second external pin being used to identify whether the testing passed or failed.

38. The internal test controller of claim 37 wherein second external pin serially transmits a serial signature analyzer value after assertion of the first external pin.

39. The internal test controller of claim 30 wherein the internal test controller accesses a bus structure having M bits and at least one of the embedded memories in the plurality of embedded memories has N bits, where N is greater than M and both N and M are positive finite integers, the internal test controller testing the N bits within the embedded memory in more than one M bit portions.

40. An data processor having a plurality of embedded memories, the data processor comprising:

an internal test controller, the internal test controller comprising:
a test pattern generator that generates a test pattern for the plurality of embedded memories and sequentially selects each embedded memory of the plurality of embedded memories; and
a memory verification element that is operably coupled to the test pattern generator, wherein the memory verification element verifies integrity of the plurality of embedded memories based on results of memory testing the plurality of embedded memories using the test pattern;
a first storage device for storing data being read from each embedded memory within the plurality of embedded memories;
a second storage device for storing at least a portion of the test pattern from the internal test controller; and
a bi-directional bus coupled among the first storage device, the second storage devices, the memory verification element, and the test pattern generator, the bi-directional bus being internal to the data processor, the bi-directional bus allowing data within the first storage device to be selectively communicated to the memory verification element, and allowing the at least a portion of the test pattern to be selectively stored within the second storage device in a time-multiplexed manner.

41. An integrated circuit wafer comprising:

a plurality of integrated circuit chips wherein each of the chips in the plurality of integrated circuit chips has one built-in self-test controller for testing a plurality of memories on each of the integrated circuit chips;
a conductive metallic clock interconnect coupled across the integrated circuit wafer to each integrated circuit chip in the plurality of integrated circuit chips, the integrated circuit wafer requiring at least one signal via the conductive metallic clock interconnect to invoke wafer-level integrated circuit testing and requiring a clock signal to each integrated circuit die to perform wafer-level integrated circuit testing, each of the chips in the plurality of integrated circuit chips providing at least one output signal from a signature analyzer to identify which integrated circuits passed testing and which integrated circuits failed testing; and
conductive elements coupled to the at least one output signal of each integrated circuit chip in the plurality of integrated circuit chips to detect which integrated circuits passed testing and which integrated circuits failed testing.

42. The method of claim 1 wherein the steps of generating, transmitting, storing, reading, and verifying are performed for each embedded memory in the plurality of embedded memories.

43. The method of claim 1 wherein the steps of generating, transmitting, storing, reading, and verifying are performed several times for the one embedded memory wherein each time uses a different test pattern.

44. The method of claim 1 wherein the verification storage element is a signature analyzer circuit.

45. A method for internally testing a plurality of embedded memories of a data processor, wherein the data processor is formed on a single integrated circuit and at least two of the plurality of embedded memories are different in physical placement within the single integrated circuit, the method comprising the steps of:

generating, by an internal test controller of the data processor, a test pattern for testing the plurality of embedded memories, the test pattern having a plurality of bits;
transmitting the plurality of bits of the test pattern in a parallel manner via at least one bus of the data processor to one embedded memory in the plurality of embedded memories, the transmitting being performed by a bus totally internal to the single integrated circuit;
reading, by the internal test controller, the at least a portion of the test pattern from the predetermined cells of the one embedded memory, the reading being performed by the bus totally internal to the single integrated circuit, wherein the step of reading is time multiplexed from the step of writing;
storing at least a portion of the test pattern within predetermined cells of the one embedded memory; and
verifying, by the internal test controller via the steps of reading and storing, that the one embedded memory is functioning properly, the verifying being performed by storing data in a verification storage element wherein the storage element is a signature analyzer having a feedback path from an output to an input of the signature analyzer.

46. A method for internally testing memories which are coupled to a CPU within an integrated circuit, the method comprising the steps of:

(a) generating a test pattern and a memory test address internal to the integrated circuit using a set of intercoupled state machines and counters;
(b) applying the test pattern to each memory location in a selected memory within the integrated circuit, the selected memory being identified via the memory test address;
(c) reading contents of the selected memory written to in step (b);
(d) processing the contents internal to the integrated circuit to determine an integrity data value where the integrity data value is a function of all past contents read from the selected memory;
(e) generating a different test pattern to use as the test pattern and repeating steps (b) through (e) wherein the repeating of steps (b) through (e) is performed until all of a plurality of predetermined test patterns are exhausted; and
(f) selecting a new selected memory that has not been tested and repeating steps (a) through (f) until all memories have been tested.

47. A method for internally testing memories which are coupled to a CPU within an integrated circuit, the method comprising the steps of:

(a) generating a test pattern and address internal to the integrated circuit;
(b) applying the test pattern to each memory location in each memory within the integrated circuit;

(c) reading contents of the each memory;

(d) processing the contents via a signature analyzer internal to the integrated circuit to determine an integrity data value where the integrity data value is a function of all past contents read from the memories due to a feedback path from an output of the signature analyzer to an input of the signature analyzer; and (e) generating a different test pattern to use as the test pattern and repeating steps (a) through (e) wherein the repeating of steps (a) through (e) is performed until all of a plurality of predetermined test patterns are exhausted.

48. The integrated circuit wafer of claim 41 wherein the conductive metallic clock interconnect is coupled to a conductive pad on the integrated circuit wafer and the conductive pad is coupled to a wafer probe, wherein the wafer probe provides a clock signal to each of the integrated circuit chips in the plurality of integrated circuit chips across the integrated circuit wafer.

49. The integrated circuit wafer of claim 41 wherein a ground conductive metallic interconnect and a power conductive metallic interconnect provide a ground potential and a power potential to each of the integrated circuit chips in the plurality of integrated circuit chips across the integrated circuit wafer.

50. The integrated circuit wafer of claim 41 wherein a control signal conductive metallic interconnect provides an invoke built-in-self-test (BIST) control signal to each of the integrated circuit chips in the plurality of integrated circuit chips across the integrated circuit wafer.

* * * * *